US 6,709,987 B2
United States Patent
Hashim et al.

(10) Patent No.: US 6,709,987 B2
(45) Date of Patent: Mar. 23, 2004

(54) METHOD AND APPARATUS FOR FORMING IMPROVED METAL INTERCONNECTS

(75) Inventors: Imran Hashim, San Jose, CA (US); Tony Chiang, Mountain View, CA (US); Barry Chin, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/067,709

(22) Filed: Feb. 5, 2002

(65) Prior Publication Data

US 2002/0115287 A1 Aug. 22, 2002

Related U.S. Application Data

(63) Continuation of application No. 09/928,891, filed on Aug. 13, 2001, now Pat. No. 6,559,061, which is a continuation of application No. 09/126,890, filed on Jul. 31, 1998, now Pat. No. 6,287,977.

(51) Int. Cl.⁷ ............................................. H01L 21/302

(52) U.S. Cl. ........................ 438/722; 438/695; 438/687

(58) Field of Search ................................ 438/694–722, 438/680, 687, 623, 624

(56) References Cited

U.S. PATENT DOCUMENTS

| 3,410,774 A | 11/1968 | Barson et al. |
| 4,358,338 A | 11/1982 | Downey et al. |
| 4,565,601 A | 1/1986 | Kakehi et al. |
| 4,681,653 A | 7/1987 | Purdes et al. |

(List continued on next page.)

FOREIGN PATENT DOCUMENTS

| EP | 0 123 456 A2 | 10/1984 |
| EP | 0 297 502 A2 | 1/1989 |
| EP | 0 202 572 B1 | 12/1993 |
| EP | 0 735 577 A2 | 10/1996 |
| EP | 0 798 778 A2 | 10/1997 |
| EP | 0 892 428 A2 | 1/1999 |
| EP | 0 788 160 A3 | 6/1999 |
| JP | 61261472 A2 | 11/1986 |
| JP | 02134164 | 5/1990 |
| JP | 4030421 A2 | 2/1992 |
| JP | 8213119 A2 | 8/1996 |

OTHER PUBLICATIONS

US 5,863,392, 1/1999, Drummond et al. (withdrawn)
H. Koenig et al., "RF Sputtering System with Variable Substrate Bias", Jul. 1970, IBM Technical Disclosure Bulletin, vol. 13, No. 2, pp. 323–324.
L.J. Kochel, "Pressure Control of RF Bias for Sputtering", Dec. 1976, Rev. Sci. Instrum., vol. 47, No. 12, pp. 1556–1557.

(List continued on next page.)

Primary Examiner—Caridad Everhart
Assistant Examiner—Calvin Lee
(74) Attorney, Agent, or Firm—Dugan & Dugan

(57) ABSTRACT

Methods of forming copper interconnects free from via-to-via leakage currents and having low resistances are disclosed. In a first aspect, a barrier layer is deposited on the first metal layer prior to copper oxide sputter-etching to prevent copper atoms from reaching the interlayer dielectric and forming via-to-via leakage current paths therein. In a second aspect, a capping dielectric barrier layer is deposited over the first metal layer prior to sputter etching. During sputter-etching, the capping dielectric barrier layer redistributes on the sidewalls of the interlayer dielectric, preventing sputter-etched copper atoms from reaching the interlayer dielectric and forming via-to-via leakage paths therein. In a third aspect, both a capping dielectric barrier layer and a barrier layer are deposited over the first metal layer prior to sputter-etching to prevent copper atoms produced during sputter-etching from reaching the interlayer dielectric and forming via-to-via leakage paths therein.

25 Claims, 10 Drawing Sheets

U.S. PATENT DOCUMENTS

| | | |
|---|---|---|
| 4,732,761 A | 3/1988 | Machida et al. |
| 4,756,801 A | 7/1988 | Jokinen et al. |
| 4,756,810 A | 7/1988 | Lamont, Jr. et al. |
| 4,767,496 A | 8/1988 | Hieber |
| 4,793,895 A | 12/1988 | Kaanta et al. |
| 4,810,335 A | 3/1989 | Hieber |
| 4,816,126 A | 3/1989 | Kamoshida et al. |
| 4,824,546 A | 4/1989 | Ohmi |
| 4,865,712 A | 9/1989 | Mintz |
| 4,874,493 A | 10/1989 | Pan |
| 4,874,494 A | 10/1989 | Ohmi |
| 4,891,112 A | 1/1990 | Wong |
| 4,915,806 A | 4/1990 | Lardon et al. |
| 4,962,060 A | 10/1990 | Sliwa et al. |
| 4,963,239 A | 10/1990 | Shimamura et al. |
| 4,968,374 A | 11/1990 | Tsukada et al. |
| 4,999,096 A | 3/1991 | Nihei et al. |
| 5,069,770 A | 12/1991 | Glocker |
| 5,078,847 A | 1/1992 | Grosman et al. |
| 5,124,014 A | 6/1992 | Foo et al. |
| 5,126,028 A | 6/1992 | Hurwitt et al. |
| 5,178,739 A | 1/1993 | Barnes et al. |
| 5,221,640 A | 6/1993 | Sato |
| 5,262,354 A | 11/1993 | Cote et al. |
| 5,270,264 A | 12/1993 | Andideh et al. |
| 5,271,972 A | 12/1993 | Kwok et al. |
| 5,302,266 A | 4/1994 | Grabarz et al. |
| 5,303,139 A | 4/1994 | Mark |
| 5,308,793 A | 5/1994 | Taguchi et al. |
| 5,346,600 A | 9/1994 | Nieh et al. |
| 5,350,479 A | 9/1994 | Collins et al. |
| 5,354,712 A | 10/1994 | Ho et al. |
| 5,371,042 A | 12/1994 | Ong |
| 5,376,584 A | 12/1994 | Agarwala |
| 5,482,611 A | 1/1996 | Helmer et al. |
| 5,486,492 A | 1/1996 | Yamamoto et al. |
| 5,510,011 A | 4/1996 | Okamura et al. |
| 5,512,150 A | 4/1996 | Bourez et al. |
| 5,516,399 A | 5/1996 | Balconi-Lamica et al. |
| 5,534,460 A | 7/1996 | Tseng et al. |
| 5,584,974 A | 12/1996 | Sellers |
| 5,585,673 A | 12/1996 | Joshi et al. |
| 5,585,974 A | 12/1996 | Shrinkle |
| 5,589,041 A | 12/1996 | Lantsman |
| 5,591,269 A | 1/1997 | Arami et al. |
| 5,612,254 A | 3/1997 | Mu et al. |
| 5,613,296 A | 3/1997 | Kurino et al. |
| 5,639,357 A | 6/1997 | Xu |
| 5,651,865 A | 7/1997 | Sellers |
| 5,654,232 A | 8/1997 | Gardner |
| 5,674,787 A | 10/1997 | Zhao et al. |
| 5,685,959 A | 11/1997 | Bourez et al. |
| 5,685,961 A | 11/1997 | Pourrezaei et al. |
| 5,693,563 A | 12/1997 | Teong |
| 5,718,813 A | 2/1998 | Drummond et al. |
| 5,725,739 A | 3/1998 | Hu |
| 5,731,245 A | 3/1998 | Joshi et al. |
| 5,744,376 A | 4/1998 | Chan et al. |
| 5,759,906 A | 6/1998 | Lou |
| 5,770,023 A | 6/1998 | Sellers |
| 5,780,357 A | 7/1998 | Xu et al. |
| 5,807,467 A | 9/1998 | Givens et al. |
| 5,810,963 A | 9/1998 | Tomioka |
| 5,810,982 A | 9/1998 | Sellers |
| 5,846,332 A | 12/1998 | Zhao et al. |
| 5,858,184 A | 1/1999 | Fu et al. |
| 5,865,961 A | 2/1999 | Yokoyama et al. |
| 5,897,752 A | 4/1999 | Hong et al. |
| 5,904,565 A | 5/1999 | Nguyen et al. |
| 5,933,753 A | 8/1999 | Simon et al. |
| 5,966,634 A | 10/1999 | Inohara et al. |
| 5,968,327 A | 10/1999 | Kobayashi et al. |
| 5,976,327 A | 11/1999 | Tanaka |
| 5,985,762 A | 11/1999 | Geffken et al. |
| 6,001,420 A | 12/1999 | Mosely et al. |
| 6,042,700 A | 3/2000 | Gopalraja et al. |
| 6,051,114 A | 4/2000 | Yao et al. |
| 6,080,284 A | 6/2000 | Miyaura |
| 6,106,625 A | 8/2000 | Koai et al. |
| 6,110,821 A | 8/2000 | Kohara et al. |
| 6,136,693 A | 10/2000 | Chan et al. |
| 6,291,885 B1 | 9/2001 | Cabral, Jr. et al. |
| 6,375,810 B2 | 4/2002 | Hong |

OTHER PUBLICATIONS

K. Suzuki et al., "Microwave Plasma Etching", Nov., 1997, Japanese Journal of Applied Physics, vol. 16, No. 11, pp. 1979–1984.

H. Kotani et al., "Sputter–Etching Planarization for Multi-level Metallization", Mar. 1983, J. Electrochem. Soc., vol. 130, No. 3, pp. 645–648.

K. Suzuki, "Microwave Plasma Etching", 1984, Central Research Laboratory, Hitachi Ltd., pp. 953–957.

S. Matsuo, "Reactive Ion–Beam Etching and Plasma Deposition Techniques Using Electron cyclotron Resonance Plasmas", 1985, Aisugi Electrical Communication Laboratory, pp. 75–117.

Homma et al., Planar Deposition of Aluminum by RF/DC Sputtering with RF Bias, Jun., 1985, J. Electrochem. Soc., Solid State Sci & Tech., vol. 132, No. 6, pp. 1466–1471.

"SypherLine by MTi", Nov., 1985, Semiconductor International.

H.P. Bader et al., "Planarization by Radio–Frequency Bias Sputtering of Aluminum as Studied Experimentally and by Computer Simulation", Nov./Dec. 1985, J.Vac.Sci.Technol.A3(6), pp. 2167–2171.

Technical Staff, MTI Thin Film Equipment Division, "Planarizing Enhancement Mode "Sputtering . . . Plus"(TM) for Planarized Aluminum in Sypherline(TM)", Apr., 1986, Applications Note, vol. 1, No. 1.

D.W. Skelly et al., "Significant Improvement in Step Coverage Using Bias Sputtered Aluminum", May/Jun., 1986, J.Vac.Sci.Technol. A4(3), pp. 457–460.

M. Yamashita, "Fundamental Characteristics of Built–In High–Frequency Coil–Type Sputtering Apparatus", Mar./Arp. 1989, J.Vac.Sci.Technol.A, vol. 7, No. 2, pp. 151–158.

M. Matsuoka et al., "Dense Plasma Production and Film Deposition by New High–Rate Sputtering Using an Electric Mirror", Jul./Aug. 1989, J.Vac.Sci.Technol A7(4), pp, 2651–2657.

P. Kidd, "A Magnetically Confined and Electron Cyclotron Resonance Heated Plasma Machine for Coating and Ion Surface Modification Use", May/Jun. 1991, J.Vac.Sci.Technol.A., pp. 466–473.

J. Musil, "Unbalanced Magnetrons and New Sputtering Systems with Enhanced Plasma Ionization", May/Jun. 1991, J.Vac.Sci.Technol.A9(3), pp. 1171–1177.

I. Ivanov, et al., "Electron Energy Distribution Function in a DC Mangetron Sputtering Discharge", 1992, Vacuum, vol. 43, No. 8, pp. 837–842.

C. Nender, "High Bias Sputtering for Large–Area Selective Deposition", 1993, Thin Solid Films, vol. 228, pp. 87–90.

S. Samukawa, "Wave Propagation and Plasma Uniformity in an Electron Cyclotron Resonance Plasma", Sep/Oct 1993, J.Vac.Sci.Technol.A 11(5) pp. 2572–2576.

W.M. Holber, "Copper Deposition by Electron Cyclotron Resonance Plasma", Nov./Dec. 1993, J.Vac.Sci.Technol.A 11(6), pp. 2903–2910.

W.D. Getty, "Size–Scalable, 2.45–GHz Electron Cyclotron Resonance Plasma Source Using Permanent Magnets and Waveguide Coupling", Jan./Feb. 1994, J.Vac.Sci.Technol B 12(1), pp. 408–415.

S. Hamaguichi et al., "Simulations of Trench–lling pro les Under Ionized Magnetron Sputter Metal Deposition", Mar./Apr. 1995, J.Vac.Sci., Technol.B., vol. 13, No. 2, pp. 183–191.

P.F. Cheng, "Directional Deposition of Cu Into Semiconductor Trench Structures Using Ionized Magnetron Sputtering", Mar./Apr. 1995, J.Vac.Sci.Technol. B 13 (2), pp., 203–208.

I.S. Park et al., "A Novel Al–Reflow Process Using Surface Modification by the ECR Plasma Treatment and Its Application to the 256Mbit DRAM", 1994, IEEE, pp. 109–112.

S.M. Rossnagel, "Collimated Magnetron Sputter Deposition with grazing Angle Ion Bombardment", Jan./Feb. 1995, J.Vac.Sci.Technol., pp. 156–158.

D.S. Garnder et al., "Encapsulated Copper Interconnection Devices Using Sidewall Barriers", 1995, Thin Solid Films, vol. 262, p. 104–119.

Y. Shacham–Diamand, "Electroless Copper Deposition for ULSI", 1995, Thin Solid Films, pp 93–103.

T. Iijima et al., "An Amorphous Ti–Si–N Diffusion Barrier Layer of Cu Interconnections", 1995, Electronics and Communications in Japan, Part 2, vol, 78, No. 12, pp. 67–74.

S.M. Rossnagel, "Directional and Preferential Sputtering–Based Physical Vapor Deposition", 1995, Thin Solid Films 263, pp. 1–12.

T. Yasui et al., "Electron Cyclotron Resosance Plasma Generation Using a Planar Ring–Cusp Magnetic Field and a Reentrant Coaxial Cavity", Jul./Aug. 1995, J.Vac.Sci.Technol.A 13(4), pp. 2105–2109.

C. Apblett et al., "Silicon Nitride Growth In a High–Density Plasma System", Nov. 1995, Solid State Technology, pp. 73–80.

S.M. Gorbatkin, "Cu Metallization Using a Permanent Magnet Electron cyclotron Resonance Microwave Plasma/Sputtering Hybrid System", May/Jun. 1996, J.Vac.Sci.Technol. B 14(3), pp. 1853–1859.

D.D. Brown et al., "Electromigration Failure Distributions for Multi–Layer Interconnects as a Function of Line Width: Experiments and Simulation", 1996, Materials Research Society Symp.Proc.vol. 427, pp. 107–112.

S. Jang et al., Tantalum and Niobium as a Diffusion Barrier Between Copper and Silicon, 1996, Journal of Materials Science Materials in Electronics 7, pp. 271–278.

R.F. Bunshah, Handbook of Deposition Technologies for Films and Coatings; Science, Technology and Applications, Second Edition, p. 261.

K. Mikagi, "Barrier Metal Free Copper Damascene Interconnection Technology Using Atmospheric Copper Reflow and Nitrogen Doping in SiOF Film", 1996, IEEE, pp. 365–368.

U.S. patent application Ser. No. 08/768,058, filed Dec. 16, 1996 Selective Physical Vapor Deposition Conductor Filling IC Structures.

Y. Kitamoto et al., "Compact Sputtering Apparatus for Depositing Co–Cr Alloy thin Films in Magnetic Disks", 1997, Proceedings of the 4th ISSP.

M. Yamazato et al., "Preparation of TiN Thin Films by Facing Targets Magnetron Sputtering", 1997, Proceedings of the 4th ISSP.

C. Hu, "Electromigration and Diffusion in Pure Cu and Cu(Sn) Alloys", 1996, Materials Research Soc. Symp., vol. 427, pp. 95–107.

"Endpoint Detection Method for Ion Etching of Material Having a Titanium Nitride Underlayer", Research Disclosure, Feb. 1991, Number 322, (C) Kenneth Mason Publication Ltd, England.

Novellus Damascus Home Page, "12 Steps of Damascus".

Fusen Chen et al., U.S. patent application No. 08/856,116, filed May 14, 1997, entitled "Reliability Barrier Integration for CU Application".

METHOD AND APPARATUS FOR FORMING IMPROVED METAL INTERCONNECTS

This application is a continuation of U.S. patent application Ser. No. 09/928,891 filed Aug. 13, 2001, now U.S. Pat. No. 6,559,061, which is a continuation of U.S. patent application Ser. No. 09/126,890, filed Jul. 31, 1998, now U.S. Pat. No. 6,287,977, both of which are hereby incorporated by reference herein in their entirety.

FIELD OF THE INVENTION

The present invention relates to semiconductor device metal layer interconnects and more particularly to reducing the contact resistance of interconnects.

BACKGROUND OF THE INVENTION

A typical integrated circuit contains a plurality of metal pathways to provide electrical power for powering the various semiconductor devices comprising the integrated circuit, and to allow these semiconductor devices to share/exchange electrical information. Within integrated circuits, metal layers are stacked on top of one another by using intermetal or "interlayer" dielectrics that insulate the metal layers from each other. Typically, however, each metal layer must form electrical contact to an additional metal layer. Metal-layer-to-metal-layer electrical contact is achieved by etching a hole (i.e., a via) in the interlayer dielectric that separates the first and second metal layers, and by filling the resulting hole or via with a metal to create an interconnect as described further below.

The use of copper in place of aluminum as the interconnect material for semiconductor devices has grown in popularity due to copper's lower resistivity. Unlike aluminum, however, copper is highly mobile in silicon dioxide and may, as a result of infiltration of copper atoms into the dielectric, create leakage paths through a device's various dielectric layers. Copper atoms also can cause electrical defects in silicon. Accordingly, as best understood with reference to FIGS. 1A–1C described below, a semiconductor device employing copper interconnects requires the creation of encapsulating barrier layers to prevent deleterious incorporation of copper atoms into the device's various material layers.

FIGS. 1A–C show sequential cross-sectional views of the formation of a conventional copper interconnect 10 (FIG. 1C) through an aperture in a dielectric layer disposed between two copper layers, a first copper layer 11a disposed within a dielectric layer D and a second copper layer 11b. With reference to FIG. 1A, to form the copper interconnect 10, a silicon dioxide interlayer dielectric 13 is deposited over the first copper layer 11a. A first via 15 then is etched in the interlayer dielectric 13 to expose the first copper layer 11a.

Copper is highly reactive with oxygen and easily forms a surface layer of high resistivity copper oxide when exposed to an oxygen rich atmosphere. Because the first layer 11a is copper, a high resistance copper oxide layer 11a' can form on the top surface of the first copper layer 11a if the first copper layer 11a is exposed to oxygen or water vapor (e.g., air). This oxidation can occur just when the wafers, just having the vias etched therein, are moved from an etch tool to a metallization tool. The copper oxide layer 11a will complete formation once all exposed and unoxidized copper is converted to copper oxide. Accordingly, to minimize the resistance of the copper interconnect 10, the copper oxide layer 11a' must be removed. Typically the copper oxide layer 11a' is removed by sputtering the copper oxide layer 11a' with ions generated within a plasma (i.e., sputter-etching), such as argon ions generated within an argon plasma. The argon ions are accelerated toward the wafer via a negative electric bias imposed on the wafer or on the wafer support. These ions strike the wafer and the copper oxide layer 11a' at the base of the unfilled via, and eject material from the copper oxide layer 11a' (including copper immediately beneath the copper oxide) due to momentum transfer between the accelerated argon ions and the copper oxide layer 11a'.

The ejected material, which includes copper atoms 11a'', coats the interlayer dielectric 13 as shown in FIG. 1A. The copper atoms 11a'' contained in the ejected material can enter the interlayer dielectric 13 and drift therethrough under the influence of an applied electric field (e.g., a device voltage), causing deleterious interconnect-to-interconnect leakage currents (i.e., via-to-via leakage currents). Such deleterious via-to-via leakage currents, however, cannot be avoided in conventional copper interconnects if the copper oxide layer 11a' is removed. Accordingly, conventional copper interconnects suffer from either a high resistance copper oxide layer 11a' which is left in place to prevent dielectric degradation induced by copper sputtered directly on the wall of the unfilled via, or copper atom induced degradation in the dielectric which leads to via-to-via leakage currents.

Following removal of the copper oxide layer 11a', a thin barrier layer 17 (e.g., tantalum, tantalum nitride, titanium nitride, tungsten or tungsten nitride) is deposited over the interlayer dielectric 13 and the first copper layer 11a as shown in FIG. 1B. The barrier layer 17 prevents copper atoms from a subsequently deposited copper layer (namely the second copper layer 11b of FIG. 1C) from incorporating into, and thus degrading, the interlayer dielectric 13.

To complete the conventional copper interconnect 10, the second copper layer 11b is deposited over the barrier layer 17 either conformally or in the form of a copper plug 11b', as shown in FIG. 1C. A copper "seed" layer (not shown) typically is deposited prior to deposition of the copper plug 11b'. Thus, a conventional copper interconnect 10 consists of the first copper layer 11a "in contact" with the second copper layer 11b through the barrier layer 17.

Because the barrier layer 17 can have a resistivity up to 100 times greater than the resistivity of copper, the barrier layer 17 significantly increases the contact resistance of the interconnect 10 formed between the first copper layer 11a and the second copper layer 11b. Therefore, the significant advantage of copper's lower resistivity is not fully realized due to the presence of barrier layers. The barrier layer 17, however, is required to prevent further incorporation of copper atoms within the interlayer dielectric 13.

In sum, conventional copper interconnects suffer from high resistances due to the presence of barrier layers, and can suffer from via-to-via leakage currents due to sputtered copper atom incorporation in the interlayer dielectric 13 during interconnect formation. Accordingly, a need exists for an improved copper interconnect that does not suffer from either high resistance or via-to-via leakage currents.

SUMMARY OF THE INVENTION

The present invention provides an inventive copper interconnect free from copper atom via-to-via leakage current paths and preferably having a significantly reduced resistance. Specifically, in a first aspect, a barrier layer (e.g., tantalum, tantalum nitride, titanium nitride, tungsten or tungsten nitride) is deposited on the exposed first copper layer and on the interlayer dielectric prior to sputter-etching the copper oxide layer. Thereafter, the barrier layer at the bottom of the interlayer dielectric's via, and the copper oxide layer thereunder, are sputter-etched. Because the barrier layer is deposited prior to sputter-etching, during sputter-etching copper atoms from the copper oxide layer redistribute on the barrier layer rather than on the interlayer dielectric. The copper atoms are not mobile within the barrier layer, and are prevented from diffusing to and contaminating the interlayer dielectric. Accordingly, no via-to-via leakage current paths are created during copper interconnection formation.

Following sputter-etching, the second copper layer is deposited over the barrier layer and the exposed first copper layer to complete copper interconnect formation. Because the first and second copper layers are in direct contact, the high resistivity of the barrier layer is eliminated. Accordingly, the inventive copper interconnect has low resistance in addition to no via-to-via leakage current paths.

In a second aspect, a capping dielectric barrier layer (e.g., silicon nitride) is deposited over the first copper layer prior to interlayer dielectric formation. Preferably, the capping dielectric barrier layer is deposited before the first copper layer is exposed to oxygen (e.g., air) to prevent copper oxide formation on the first copper layer. Thereafter, the capping dielectric barrier layer and any copper oxide formed on the first copper layer are sputter-etched. Because the capping dielectric barrier layer is sputter-etched first, it is redistributed on the sidewalls of the interlayer dielectric and serves as a diffusion barrier to any copper atoms (from the underlying copper oxide layer) that may redistribute on the sidewalls during sputter-etching. The redistributed capping dielectric barrier layer material thus prevents copper atoms from entering the interlayer dielectric and creating via-to-via current leakage paths therein.

The copper interconnect is completed by depositing a barrier layer over the exposed first copper layer, and by depositing a second copper layer over the barrier layer. The presence of the barrier layer between the first and second copper layers increases the copper interconnect's resistance. However, unlike the prior art, the copper interconnect does not suffer from via-to-via leakage currents. Further, the capping dielectric barrier layer may be used advantageously as an etch stop layer if so desired.

A third aspect of the invention also employs the capping dielectric barrier layer. However, unlike the second aspect, the barrier layer is deposited on the capping dielectric barrier layer and on the interlayer dielectric prior to sputter-etching. Thereafter, the barrier layer, the capping dielectric barrier layer, and any copper oxide formed on the first copper layer are etched, and the second copper layer is deposited directly on the exposed first copper layer, making direct contact therebetween.

Both the barrier layer and the material from the capping dielectric barrier layer which redistributes on the sidewalls of the interlayer dielectric prevent sputter-etched copper atoms from reaching the interlayer dielectric. Via-to-via leakage currents thereby are eliminated. Because the first and second copper layers are in direct contact (the barrier layer having been removed), the inventive copper interconnect has low resistance. Like the second aspect, the capping dielectric barrier layer of the third aspect may serve as an etch stop layer and preferably is deposited prior to exposing the first copper layer to oxygen.

For the first and third aspects, preferably the deposition of the barrier layer on the sidewalls of the interlayer dielectric is performed "simultaneously" with either the sputter-etching of the copper oxide layer (first aspect) or the capping dielectric barrier layer and the copper oxide layer (third aspect). Simultaneous deposition/sputter-etching may be performed within a high density plasma (HDP) sputtering chamber by adjusting the chamber's RF coil power and RF wafer bias to achieve the desired deposition/sputter-etching ratio. Alternatively, deposition of the barrier layer and sputter-etching of the copper oxide layer and the capping dielectric barrier layer may be performed "sequentially" within the same chamber or by depositing the barrier layer within a first processing chamber (e.g., an HDP chamber) and by sputter-etching any copper oxide layer and any capping dielectric barrier layer within a separate processing chamber (e.g., a sputter-etching chamber such as Applied Materials' Preclean II chamber). In either case, deposition of the second copper layer preferably is performed prior to breaking vacuum so as to maintain a copper-oxide free interface between the first and second copper layers.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

In the preferred aspects of the present invention, copper interconnect formation is performed primarily within a high density plasma sputtering chamber (although interconnect vias may be filled by a process for filling vias, such as chemical vapor deposition (CVD), physical vapor deposition (PVD) or electroplating as is known in the art). Accordingly, before discussing the preferred aspects for copper interconnect formation, the operation of such a high density plasma sputtering chamber is described briefly with reference to FIG. 2.

Figure 2:
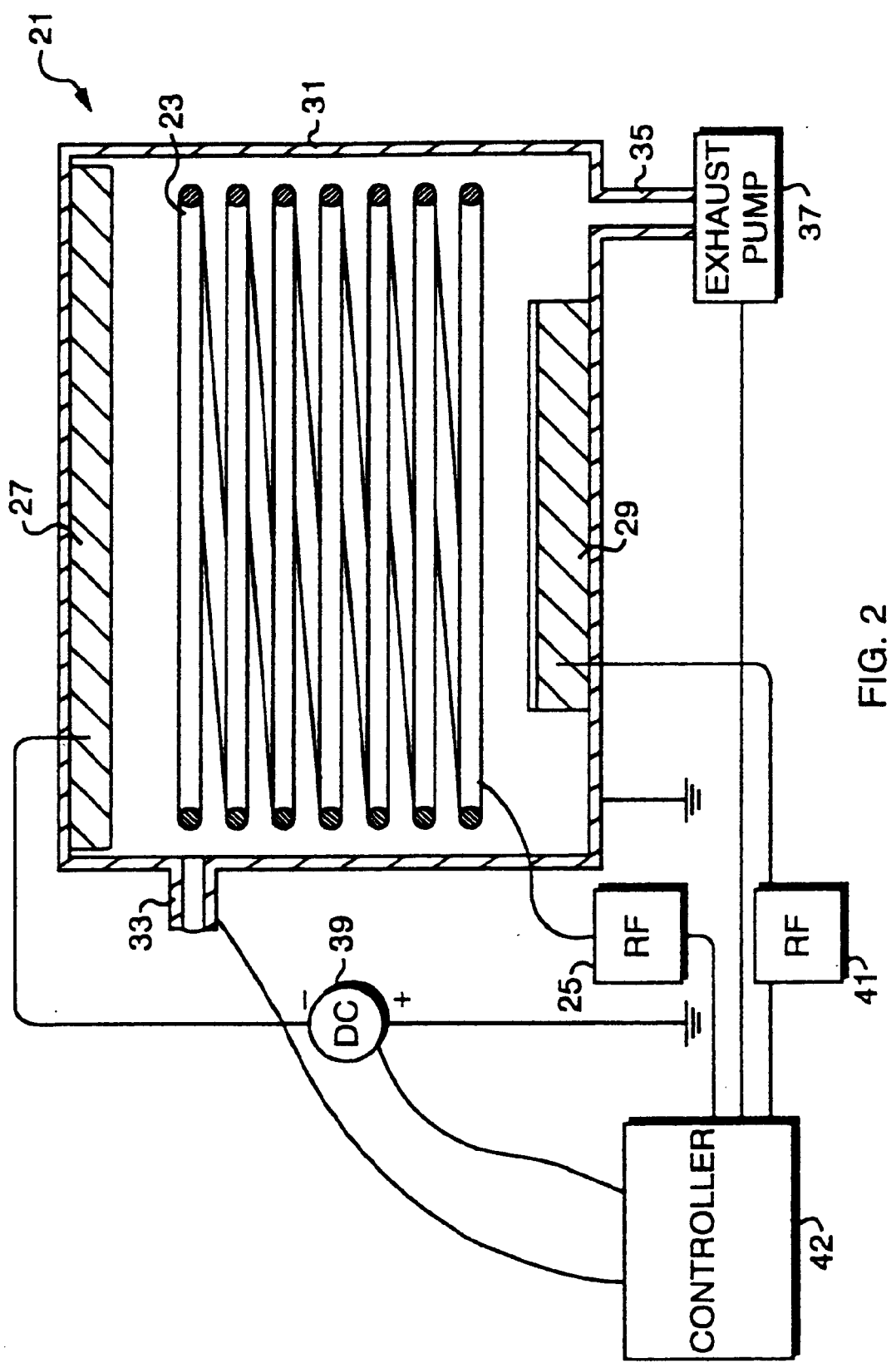
FIG. 2 is a diagrammatic illustration, in section, of the pertinent portions of an high density plasma sputtering chamber for practicing the present invention.

FIG. 2 is a side diagrammatic illustration, in section, of the pertinent portions of a high density plasma sputtering chamber 21 for practicing the present invention. The sputtering chamber 21 contains a wire coil 23 which is operatively coupled to a first RF power supply 25. The wire coil 23 may comprise a plurality of coils, a single turn coil as shown in FIG. 2, a single turn material strip, or any other similar configuration. As shown in FIG. 2, the wire coil 23 is positioned along the inner surface of the sputtering chamber 21, between a sputtering target 27 and a substrate support pedestal 29. The substrate support pedestal 29 is positioned in the lower portion of the sputtering chamber 21 and the sputtering target 27 is mounted in the upper portion of the sputtering chamber 21 and facing the substrate receiving surface of the support. The sputtering chamber 21 generally includes a vacuum chamber enclosure wall 31 having at least one gas inlet 33 and having an exhaust outlet 35 operatively coupled to an exhaust pump 37.

The sputtering target 27 and the substrate support pedestal 29 are electrically isolated from the enclosure wall 31. The enclosure wall 31 preferably is grounded so that a negative voltage (with respect to grounded enclosure wall 31) may be applied to the sputtering target 27 via a DC power supply 39 operatively coupled between the target 27 and the enclosure wall 31, and a negative bias may be applied to the substrate support pedestal 29 via a second RF power supply 41 operatively coupled between the pedestal 29 and ground. A controller 42 is operatively coupled to the first RF power supply 25, the DC power supply 39, the second RF power supply 41, the gas inlet 33 and the exhaust outlet 35.

If, for example, the sputtering chamber 21 is configured for deposition of tantalum nitride layers, a tantalum target 27 is employed. Typically, both argon and nitrogen gas are flowed into the sputtering chamber 21 through the gas inlet 33 (multiple inlets, one for each gas, may be used), while a power signal is applied to the coil 23 via the first RF power supply 25, and a power signal is applied to the target 27 via the DC power supply 39. During steady-state processing, nitrogen may react with the tantalum target 27 to form a nitride film on the tantalum target 27 so that tantalum nitride is sputtered therefrom. Additionally, non-nitrided tantalum atoms are also sputtered from the target, which atoms can combine with nitrogen to form tantalum nitride in flight or on a wafer (not shown) supported by the pedestal 29.

In operation, a throttle valve (not shown) operatively coupled to the exhaust outlet 35 is placed in a mid-position in order to maintain the deposition chamber 21 at a desired low vacuum level of about $1 \times 10^{-8}$ torr prior to introduction of the process gas(es) into the chamber. To commence processing within the sputtering chamber 21, a mixture of argon and nitrogen gas is flowed into the sputtering chamber 21 via the gas inlet 33. After the gas stabilizes at a pressure of about 10–100 millitorr (preferably 10–60 millitorr, and more preferably 15–30 millitorr), DC power is applied to the tantalum target 27 via the DC power supply 39 and an RF power signal is applied to the coil 23 via the first RF power supply 25 (while the gas mixture continues to flow into the sputtering chamber 21 via the gas inlet 33 and is pumped therefrom via the pump 37). The DC power applied to the target 27 and coil 23 causes the argon/nitrogen gas mixture to form a plasma and to generate argon and nitrogen ions which are attracted to, and strike the target 27 causing target material (e.g., tantalum and tantalum nitride) to be ejected therefrom. The ejected target material travels to and deposits on a wafer (not shown) supported by the pedestal 29.

By adjusting the duty cycle of the RF power signal applied to the substrate support pedestal 29, a negative bias can be created between the substrate support pedestal 29 and the plasma. The negative bias between the substrate support pedestal 29 and the plasma causes argon ions to accelerate toward the pedestal 29 and any wafer supported thereon. Accordingly, a wafer may be sputter-etched by the argon ions at the same time the tantalum nitride material from the target 27 deposits on the wafer (i.e., simultaneous deposition/sputter-etching), as is well known in the art. This type of simultaneous deposition/sputter-etching within the chamber 21 may be advantageously employed for the inventive copper interconnect formation methods disclosed herein, as described below.

Figure 3A:
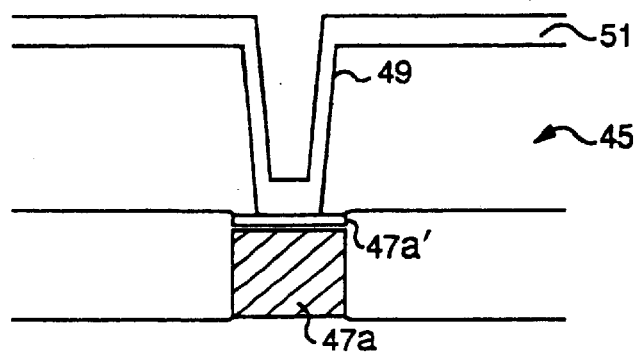
FIGS. 3A–C are sequential cross sectional views of the formation of a copper interconnect in accordance with a first aspect of the present invention.
Figure 3B:
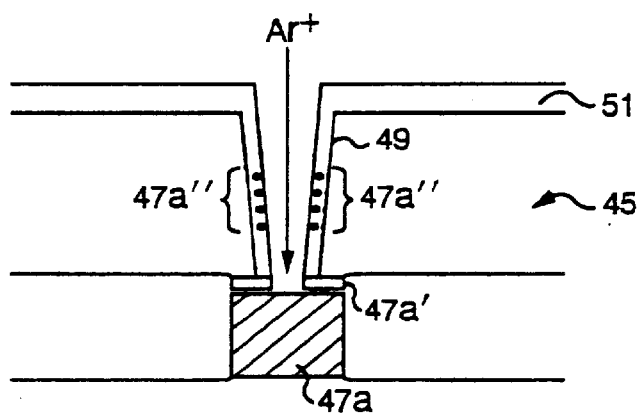
Figure 3C:
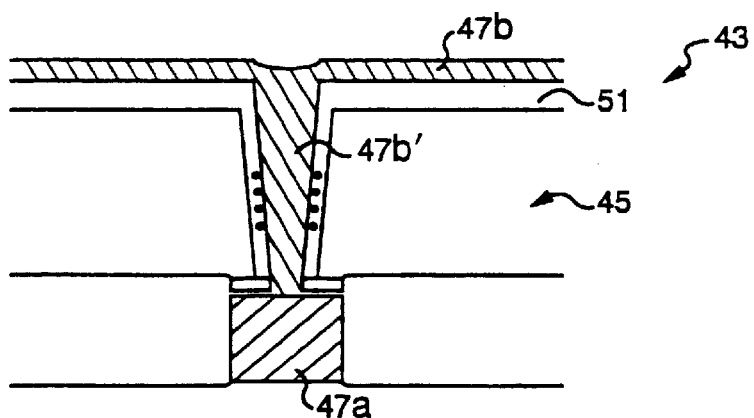

FIGS. 3A–C show sequential cross-sectional views of the formation of a first copper interconnect 43 (FIG. 3C) in accordance with a first aspect of the present invention. With reference to FIG. 3A, an interlayer dielectric 45 (e.g., silicon dioxide) is deposited over a first metal layer (e.g., a first copper layer 47a). A via 49 then is etched in the interlayer dielectric 45 to expose the first copper layer 47a.

The first metal layer may be deposited using CVD, PVD, electroplating or other such well known metal deposition techniques, and it is connected, via contacts, through a dielectric layer, to devices formed in the underlying semiconductor wafer. If the first copper layer 47a is exposed to oxygen, such as when the wafer is moved from an etching chamber in which the oxide overlaying the first copper layer is etched to create apertures for creation of vias between the first copper layer and a second to be deposited metal layer, it will readily form an insulating/high resistance copper oxide layer 47a' thereon. Accordingly, to reduce the resistance of the copper interconnect 43, any copper oxide layer 47a' and any processing residue within the via 49 must be removed. However, unlike conventional copper interconnect formation, a barrier layer 51 is deposited (e.g., within the sputtering chamber 21 of FIG. 2) over the interlayer dielectric 45 and over the exposed first copper layer 47a prior to removing the copper oxide layer 47a'. The barrier layer 51, preferably comprising tantalum, tantalum nitride, titanium nitride, tungsten or tungsten nitride prevents subsequently deposited copper layers from incorporating in and degrading the interlayer dielectric 45 (as previously described).

Following deposition of the barrier layer 51, the portion of the barrier layer 51 at the bottom of the via 49, and the copper oxide layer 47a' (and any processing residue) thereunder, are sputter-etched via an argon plasma. Note that during sputter-etching within the sputtering chamber 21 (FIG. 2), the power applied to the target 27 is either removed or is reduced to a low level (e.g., 500 W) so as to prevent significant deposition. A low target power level, rather than no target power, results in a more uniform plasma and is presently preferred.

Argon ions are accelerated toward the barrier layer 51 via an electric field (e.g., the RF signal applied to the substrate support pedestal 29 via the second RF power supply 41 of FIG. 2 which causes a negative self bias to form on the pedestal), strike the barrier layer 51, and, due to momentum transfer, sputter the barrier layer material from the base of the via aperture and redistribute it along the portion of the barrier layer 51 that coats the sidewalls of the via 49. The argon ions are attracted to the substrate in a direction substantially perpendicular thereto. As a result, little sputtering of the via sidewall, but substantial sputtering of the via base, occurs. Once the barrier layer 51 has been sputter-etched from the via base, the argon ions strike the copper oxide layer 47a', and the oxide layer is sputtered to redistribute the copper oxide layer material from the via base, some or all of the sputtered material being deposited along the portion of the barrier layer 51 that coats the sidewalls of the via 49. Copper atoms 47a'', as well, coat the barrier layer 51 disposed on the sidewalls of the via 49. However, because the originally deposited barrier layer 51 along with that redistributed from the via base to via sidewall is a diffusion barrier to the copper atoms 47a'', the copper atoms 47a'' are immobile within the barrier layer 51 and cannot reach the interlayer dielectric 45. The copper atoms 47a'' which are deposited onto the sidewall, therefore, do not generate via-to-via leakage currents as they would were they redistributed onto an uncoated sidewall.

Thereafter, to form the copper interconnect 43, a second copper layer 47b is deposited (either conformally or so as to form a copper plug 47b' as shown in FIG. 3C) over the barrier layer 51 and over the portion of the first copper layer 47a exposed at the base of each via. Because the first and second copper layers 47a, 47b are in direct contact, rather than in contact through the barrier layer 51 as in conventional copper interconnects, the resistance of the copper interconnect 43 is much lower than that of conventional copper interconnects (in addition to the interconnect's freedom from via-to-via leakage currents).

Preferably deposition of the barrier layer 51 on the sidewalls of the via 49 and sputter-etching of the barrier layer 51 and the copper oxide layer 47a' at the bottom of the via 49 occur simultaneously. Simultaneous deposition/sputter-etching may be performed with the chamber 21 of FIG. 2 by adjusting the power signals applied to the wire coil 23, the target 27 and the pedestal 29, as previously described. Because the coil 23 can be used to maintain the plasma, the plasma can sputter a wafer with a low relative bias on the wafer (less than that needed to sustain the plasma). Once the sputtering threshold has been reached, for a particular wafer bias the ratio of the RF power applied to the wire coil 23 ("RF coil power") as compared to the DC power applied to the target 27 ("DC target power") dictates the relationship between sputter-etching and deposition. For instance, the higher the RF:DC power ratio the more sputtering will occur due to increased ionization and subsequent increased ion bombardment flux to the wafer. Increasing the wafer bias (e.g., increasing the RF power supplied to the support pedestal 29) will increase the energy of the incoming ions which will increase the sputtering yield and the etch rate. For example, increasing the voltage level of the RF signal applied to the pedestal 29 increases the energy of the ions incident on the wafer, while increasing the duty cycle of the RF signal applied to the pedestal 29 increases the number of incident ions. Therefore, both the voltage level and the duty cycle of the wafer bias can be adjusted to control sputtering rate. In addition, keeping the DC target power low will decrease the amount of barrier material available for deposition. A DC target power of zero will result in sputter-etching only. A low DC target power coupled with a high RF coil power and wafer bias will result in simultaneous via sidewall deposition and via bottom sputtering. Accordingly, the process must be tailored for the material and geometries in question. For a typical 3:1 aspect ratio via on a 200 mm wafer, using tantalum or tantalum nitride as the barrier material, a DC target power of 500 W to 1 kW, at an RF coil power of 2 to 3 kW or greater, with a wafer bias of 250 W to 400 W or greater applied continuously (e.g., 100% duty cycle) will result in barrier deposition on the wafer sidewalls and removal of material from the via bottom. The lower the DC target power, the less material will be deposited on the sidewalls. The higher the DC target power, the more RF coil power and/or wafer bias power is needed to sputter the bottom of the via. A 2 kW RF coil power level on the wire coil 23 and a 250 W RF wafer power level with 100% duty cycle on the pedestal 29 presently are preferred for simultaneous deposition/sputter-etching in connection with the first and third aspects (described below) of the present invention.

It may be desirable to initially (e.g., for several seconds or more depending on the particular geometries/materials in question) apply no wafer bias during simultaneous deposition/sputter-etching to allow sufficient via sidewall coverage to prevent contamination of the sidewalls by material sputter-etched from the via bottom. For instance, initially applying no wafer bias during simultaneous deposition/sputter-etching of the via 49 ensures formation of an initial barrier layer on the sidewalls of the interlayer dielectric 45 that prevents sputtered copper atoms from contaminating the interlayer dielectric 45 during the remainder of the deposition/sputter-etching operation.

Alternatively, deposition/sputter-etching may be performed "sequentially" within the same chamber or by depositing the barrier layer 51 within a first processing chamber and by sputter-etching the barrier layer 51 and copper oxide layer 47a' within a separate, second processing chamber (e.g., a sputter-etching chamber such as Applied Materials' Preclean II chamber).

Figure 4A:
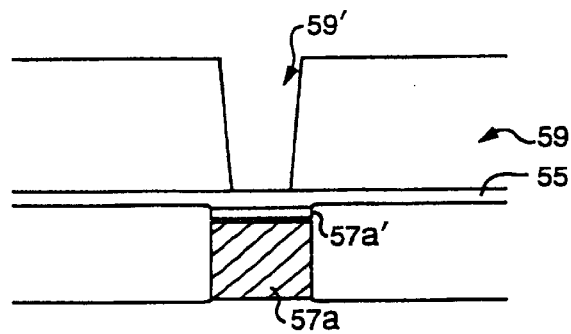
FIGS. 4A–D are sequential cross sectional views of the formation of a copper interconnect in accordance with a second aspect of the present invention.

FIGS. 4A–D show sequential cross-sectional views of the formation of a second copper interconnect 53 (FIG. 4D) in accordance with a second aspect of the present invention. With reference to FIG. 4A, a capping dielectric barrier layer (e.g., a silicon nitride layer 55) is deposited over a first metal layer (e.g., a first copper layer 57a) before the interlayer dielectric 59 is deposited and etched to form the via 59'. The thickness of the silicon nitride layer 55 is selected to be compatible with chemical mechanical polishing processes while providing adequate barrier performance (e.g., 50 to 1000 Angstroms, more preferably 150 to 500 Angstroms, and most preferably 250–300 Angstroms). If the first copper layer 57a is exposed to oxygen prior to depositing the silicon nitride layer 55, a copper oxide layer 57a' will form on the first copper layer 57a as shown in FIG. 4A (e.g., during dielectric deposition of dielectric layer D (FIG. 4A), during etch of the dielectric layer D, during copper deposition and/or etch back to form the first copper layer 57a, or during chemical metal polish of the dielectric layer D). Therefore, the silicon nitride layer 55 preferably is deposited over the first copper layer 57a prior to exposing the first copper layer 57a to oxygen (e.g., within an automated vacuum wafer processing system which provides wafer transfer between processing chambers within a vacuum environment) so as to avoid formation of the copper oxide layer 57a'. Following chemical metal polish, a thin native copper oxide layer forms on the first copper layer 57a. However, depositing the silicon nitride layer 55 shortly thereafter prevents further oxidation.

An interlayer dielectric 59 is deposited over the silicon nitride layer 55, and a via 59' is etched in the interlayer dielectric 59 so as to expose the silicon nitride layer 55. But, if the first copper layer 57a is exposed to oxygen before the silicon nitride layer 55 is deposited, the inventive method will nonetheless avoid the deleterious effects of the copper oxide, as previously described. The silicon nitride layer 55 also serves to prevent the diffusion of copper atoms from the first copper layer 57a into the interlayer dielectric 59 during formation and patterning of the interlayer dielectric 59.

Figure 4B:
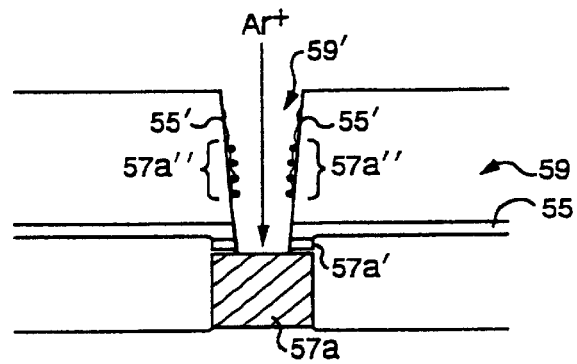

With reference to FIG. 4B, to reduce the resistance of the copper interconnect 53, the silicon nitride layer 55 (e.g., a high resistance layer), any copper oxide layer 57a' and any processing residue (e.g., left during the formation of the via 59') are sputter-etched via an argon plasma (as previously described). As the silicon nitride layer 55 is sputter-etched, silicon nitride layer material is redistributed along the sidewalls of the via 59', forming a redistributed nitride layer 55' thereon. Subsequently, when the copper oxide layer 57a' is sputter-etched, copper oxide layer material, including copper atoms 57a", redistributes along the sidewalls of the via 59' on top of the redistributed nitride layer 55'.

Because copper atoms do not diffuse within silicon nitride, the copper atoms 57a" are immobile within the redistributed nitride layer 55'. Accordingly, the copper atoms 57a" cannot diffuse to the interlayer dielectric 59 and therefore cannot create via-to-via leakage currents.

Figure 4C:
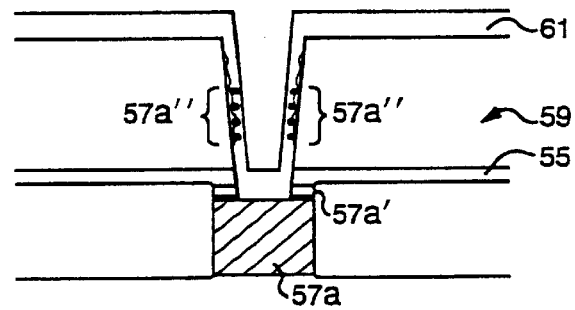
Figure 4D:
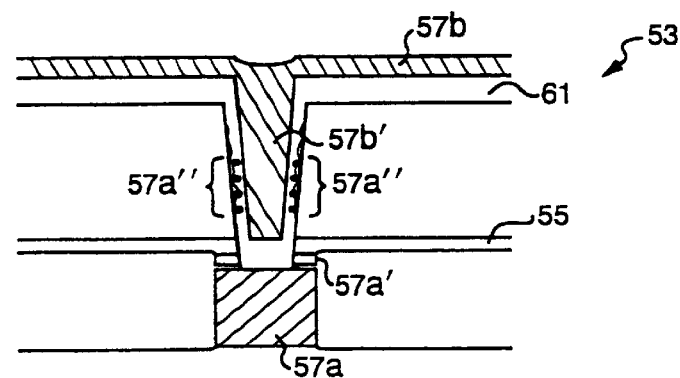

The copper interconnect 53 is completed by depositing a barrier layer 61 over the interlayer dielectric 59 and over the first copper layer 57a (exposed by sputter-etching the silicon nitride layer 55 and the copper oxide layer 57a') (FIG. 4C), and by depositing a second copper layer 57b (either conformally or so as to form a copper plug 57b') over the barrier layer 61 (FIG. 4D).

Because the first and second copper layers 57a, 57b are not in direct contact, but instead are in contact through the barrier layer 61, the copper interconnect 53 of FIG. 4D has a higher resistance than the copper interconnect 43 of FIG. 3C. However, like the copper interconnect 43 of FIG. 3C, the copper interconnect 53 of FIG. 4D does not suffer from the via-to-via leakage currents present in conventional copper interconnects. Additionally, if so desired, the silicon nitride layer 55 may be used as an etch stop when selectively removing the interlayer dielectric 59, such as during the formation of the via 59'.

Figure 5A:
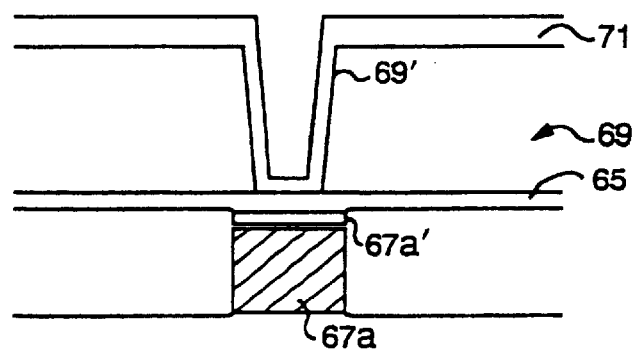
FIGS. 5A–C are sequential cross sectional views of the formation of a copper interconnect in accordance with a third aspect of the present invention.
Figure 5B:
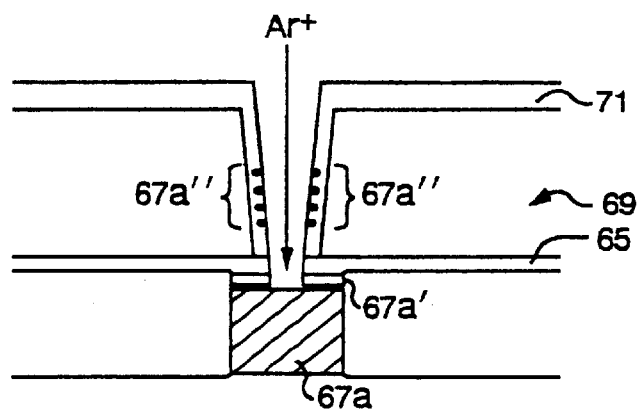
Figure 5C:
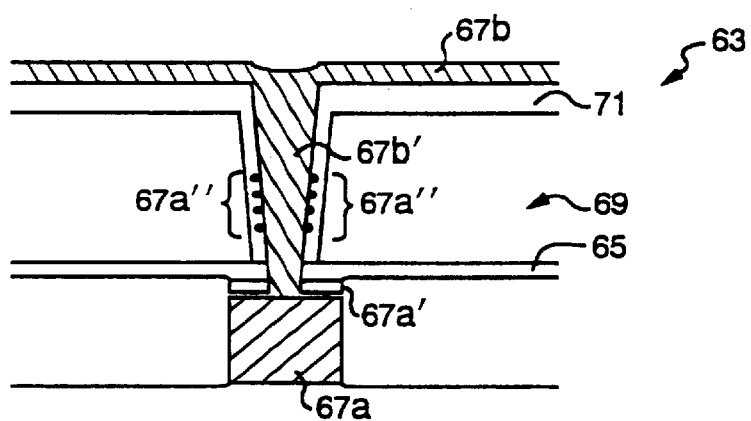

FIGS. 5A–C show sequential cross-sectional views of the formation of a third copper interconnect 63 (FIG. 5C) in accordance with a third aspect of the present invention. With reference to FIG. 5A, as with the second copper interconnect 53 of FIG. 4D, a capping dielectric barrier layer (e.g., a silicon nitride layer 65) is deposited over a first metal layer (e.g., a first copper layer 67a). If the first copper layer 67a is exposed to oxygen prior to depositing the silicon nitride layer 65, a copper oxide layer 67a' will form on the first copper layer 67a as shown in FIG. 5A. Therefore, the silicon nitride layer 65 preferably is deposited over the first copper layer 67a prior to exposing the first copper layer 67a to oxygen (e.g., without removing the wafer from the vacuum environment) so as to avoid formation of the copper oxide layer 67a'. An interlayer dielectric 69 is deposited over the silicon nitride layer 65, and a via 69' is formed in the interlayer dielectric 69 to expose the silicon nitride layer 65.

Following deposition of the interlayer dielectric 69 and formation of the via 69' therein, a barrier layer 71 (e.g., tantalum, tantalum nitride, titanium nitride, tungsten or tungsten nitride) is deposited over the interlayer dielectric 69 and the exposed silicon nitride layer 65 so as to prevent subsequently deposited copper layers from incorporating in and degrading the interlayer dielectric 69. The barrier layer 71, the silicon nitride layer 65, and any copper oxide layer 67a' which may have formed, are sputter-etched (FIG. 5B) via an argon plasma as previously described. As the barrier layer 71, the silicon nitride layer 65, and any copper oxide layer 67a' are sputter-etched, material from each layer is redistributed along the sidewalls of the via 69'. Copper atoms 67a", which are sputter-etched from the copper oxide layer 67a', deposit on the barrier layer 71 and the redistributed silicon nitride material that coats the sidewalls of the via 69'. Because both the barrier layer 71 and the silicon nitride layer 65 are diffusion barriers to copper atoms, the copper atoms 67a" cannot reach the interlayer dielectric 69, and do not generate via-to-via leakage currents.

Figure 1A:
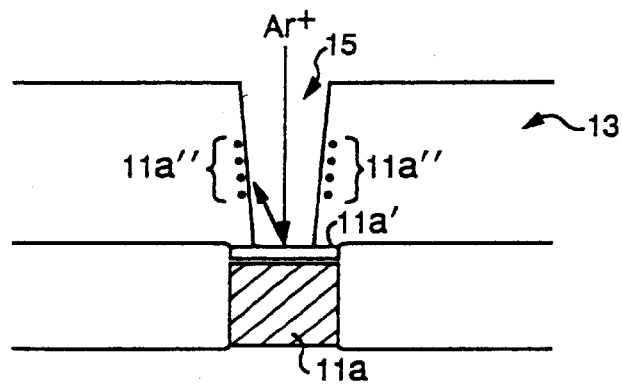
FIGS. 1A–C are sequential cross sectional views of the formation of a conventional copper interconnect as previously described.
Figure 1B:
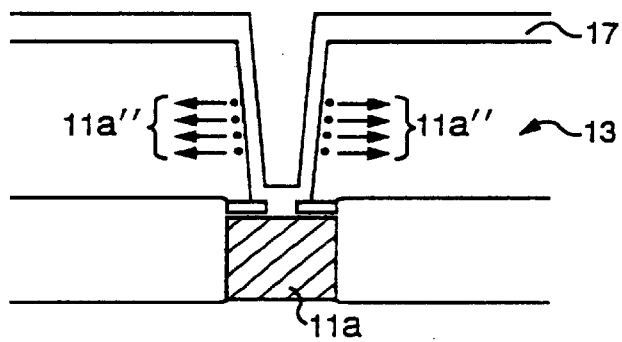
Figure 1C:
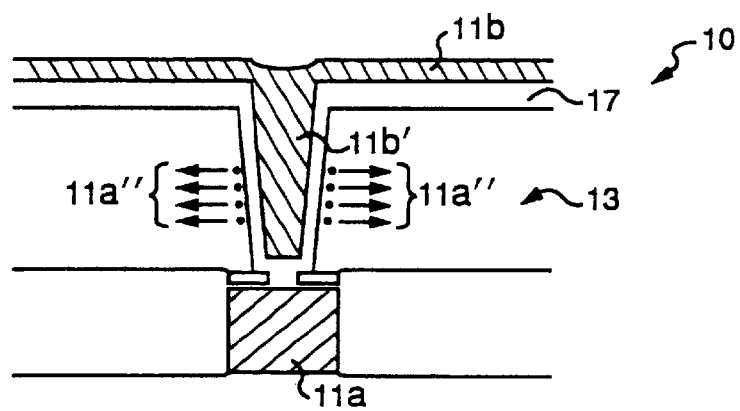

The copper interconnect 63 is completed by depositing a second copper layer 67b (either conformally or so as to form a copper plug 67b') over the barrier layer 71 and the exposed first copper layer 67a. Because the first and second metal layers 67a, 67b are in direct contact, the copper interconnect 63 has a much lower resistance than the conventional copper interconnect 10 of FIG. 1C, and the inventive copper interconnect 53 of FIG. 4D. Additionally, if so desired, the silicon nitride layer 65 may be used as an etch stop when selectively removing the interlayer dielectric 69, such as during the formation of the via 69'.

As with the barrier layer 51 of the copper interconnect 43 of FIG. 3C, deposition of the barrier layer 71 (of the copper interconnect 63 of FIG. 5C) on the sidewalls of the via 69' and sputter etching of the barrier layer 71, the silicon nitride layer 65, and any copper oxide layer 67a' at the bottom of the via 69' preferably occur simultaneously (e.g., within a high density plasma sputtering chamber). Alternatively, deposition/sputter-etching may be performed sequentially within the same chamber or within different chambers (as previously described).

Each inventive copper interconnect 43, 53 and 63, preferably is formed without breaking vacuum between exposure of the first copper layer and deposition of the second copper layer, so as to maintain a copper-oxide free interface between the various layers of each interconnect. To avoid formation of copper oxide, the exposure of the first copper layer and the deposition of the second copper layer preferably are performed within various processing chambers of an automated vacuum processing system such as Applied Materials' Endura® which provides wafer transfer within a vacuum environment, as disclosed in U.S. Pat. No. 5,186,718, the entirety of which is hereby incorporated by reference herein.

Figure 6:
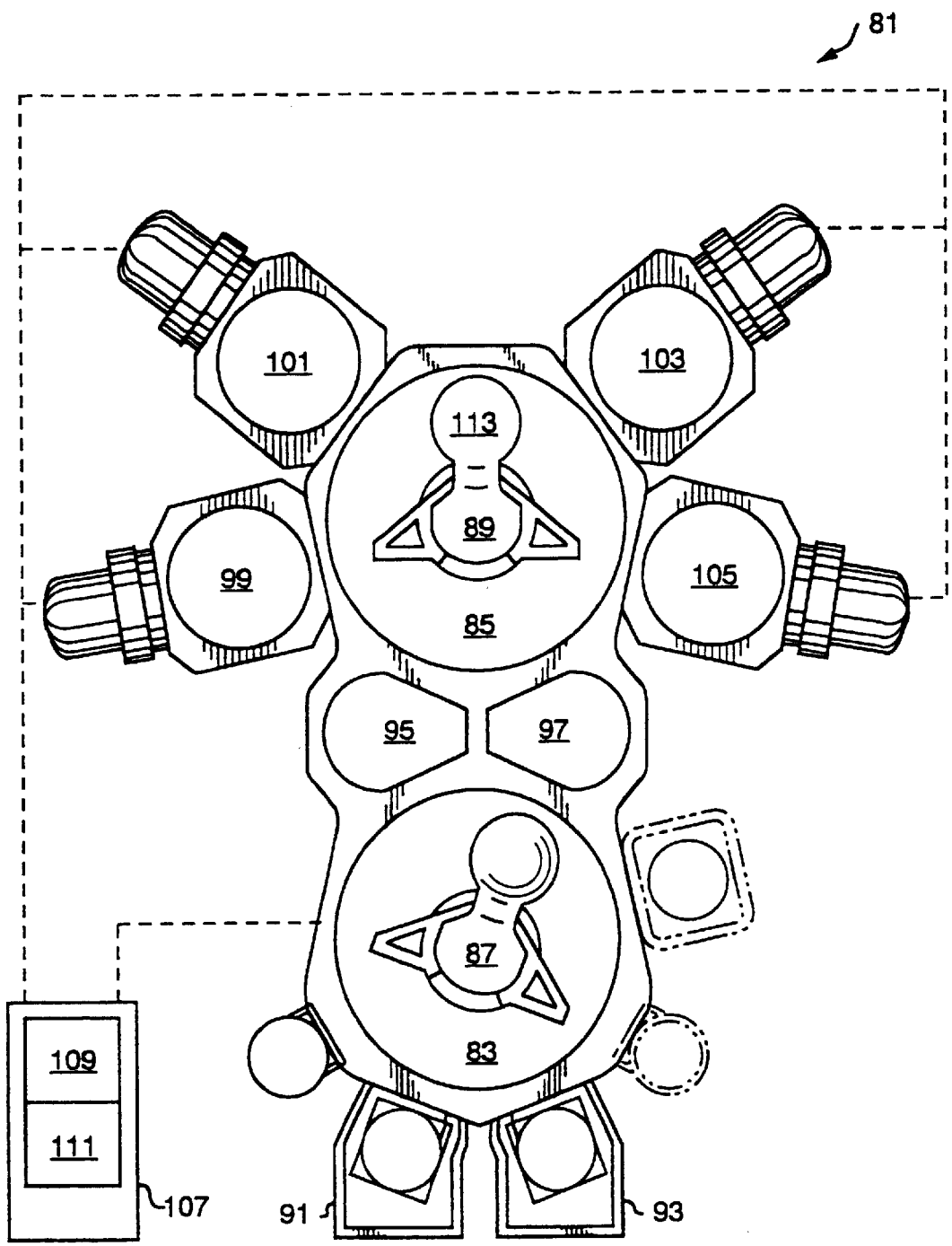
FIG. 6 is a top plan view of an automated semiconductor manufacturing tool useful for performing the inventive methods.

FIG. 6 is a top plan view of an automated semiconductor manufacturing tool 81 useful for performing the inventive methods. Specifically, the automated semiconductor manufacturing tool 81 comprises a pair of chambers, a buffer chamber 83 and a transfer chamber 85 which house a first and a second wafer handler 87, 89, respectively. The buffer chamber is operatively coupled to a pair of load locks 91, 93 and to a pair of pass-through chambers 95, 97. Other chambers such as degassing or cool-down chambers also may be coupled to the buffer chamber 83.

The transfer chamber 85 is coupled to the pass-through chambers 95, 97, and to a plurality of processing chambers 99, 101, 103 and 105. The first processing chamber 99 is for depositing barrier layers, e.g., a PVD or an HDP sputtering chamber having a tantalum or other barrier layer material sputtering target mounted therein. Preferably the first processing chamber 99 comprises the high density plasma sputtering chamber 21 of FIG. 2. The second processing chamber 101 comprises an etch chamber such as an Applied Materials' Preclean II chamber. The third processing chamber 103 comprises a PVD, HDP or CVD chamber for depositing copper seed layers. The fourth processing chamber 105 comprises a copper fill chamber such as a CVD or PVD chamber. If desired, the fill process can be performed via electroplating outside the tool 81 (rather than within the fourth processing chamber 105).

Figure 7:
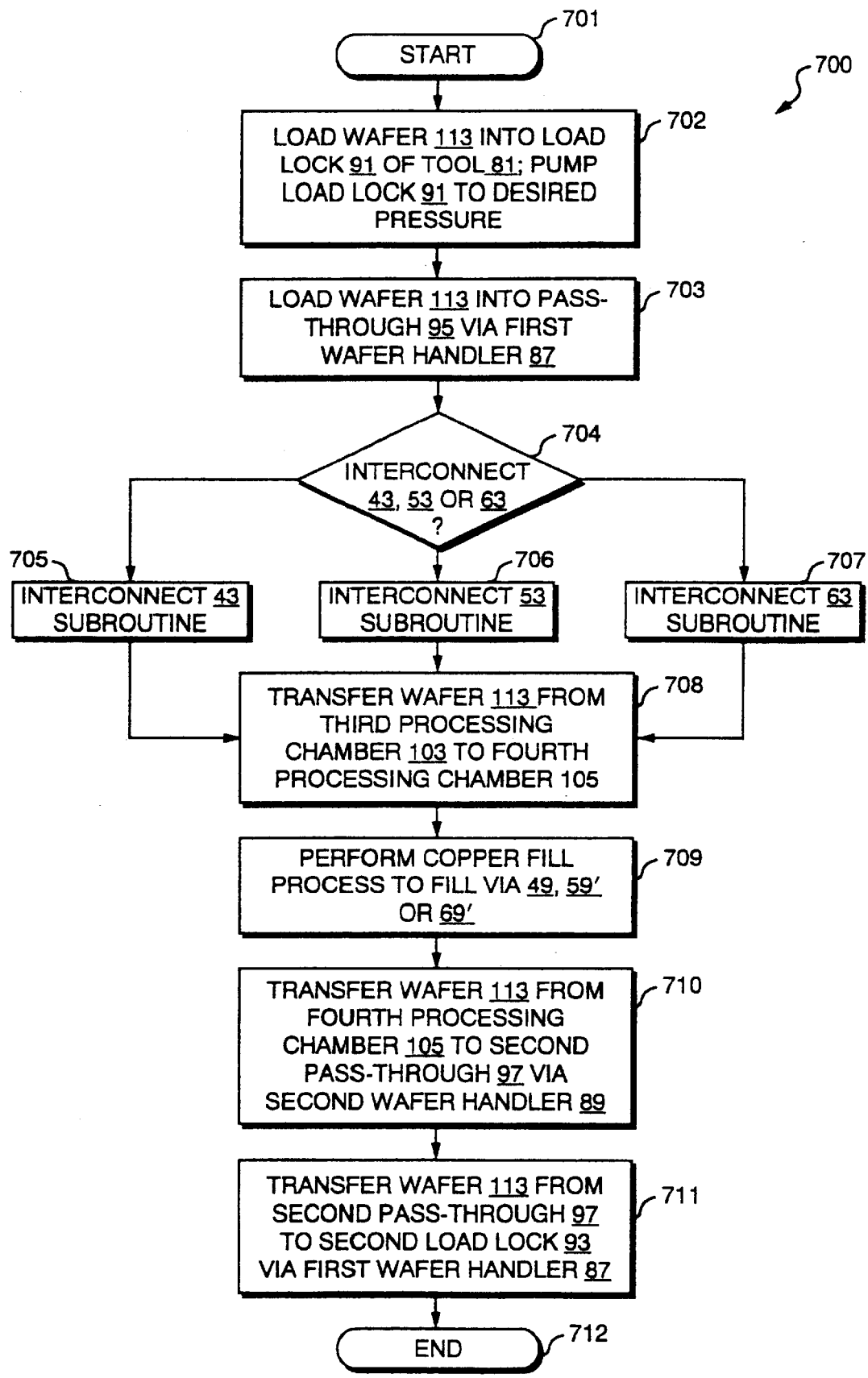
FIG. 7 is a flowchart of the operation, in pertinent part, of the automated semiconductor manufacturing tool of FIG. 6 as controlled by a controller during the formation of the inventive interconnects of FIGS. 3A–5C.

A controller 107 comprising a microprocessor 109 and memory 111 is operatively coupled to the first and second wafer handlers 87, 89, to the load locks 91, 93, to the four processing chambers 99–105, and to the various slit valves (not shown) for selectively sealing the load locks, pass-through chambers and processing chambers. The memory 111 contains a program for performing each of the interconnect formation methods described above for inventive interconnects 43, 53 and 63. In the example of FIG. 7, it is assumed that for each interconnect 43, 53 and 63, the vias 49, 59' and 69', respectively, are already formed by methods well known in the art prior to entering the tool 81.

FIG. 7 is a flowchart of the operation, in pertinent part, of the automated semiconductor manufacturing tool 81 as controlled by the controller 107 during the formation of interconnects 43, 53 and 63.

In step 701, an interconnect program 700 within the memory 111 of the controller 107 is executed.

In step 702, a wafer 113 is loaded into the load lock 91 of the tool 81 and the load lock 91 is pumped to a desired pressure (e.g., the pressure within the buffer chamber 83).

In step 703, the first wafer handler 87 transfers the wafer 113 from the first load lock 91 to the pass-through 95.

In step 704, the controller 107 selects the processing sequences for forming either the interconnect 43, the interconnect 53 or the interconnect 63 based on a previous selection by a user of the tool 81. Thereafter, the controller 107 executes either the interconnect 43 subroutine (step 705 described with reference to FIG. 8), the interconnect 53 subroutine (step 706 described with reference to FIG. 9) or the interconnect 63 subroutine (step 707 described with reference to FIG. 10). As described below, following any of these subroutines, the wafer 113 is contained within the third processing chamber 103 where a copper seed layer is deposited on the wafer 113.

Thus, following completion of an interconnect subroutine, the wafer 113 is transferred by the second wafer handler 89 from the third processing chamber 103 to the fourth processing chamber 105, as indicated by step 708.

In step 709, a copper fill process is performed on the wafer 113 to fill the via 49, 59' or 69' with copper so as to complete formation of the copper interconnect (either the interconnect 43, 53 or 63, respectively). The fill process may be a conventional CVD or PVD fill process as is known in the art, or the fill process may be subsequently performed via electroplating outside the vacuum environment of the tool 81. Preferably the copper fill process comprises the fill process disclosed in U.S. patent application Ser. No. 08/768, 058, filed Dec. 16, 1996, titled "Selective Physical Vapor Deposition Conductor Fill in IC Structures," the entirety of which is hereby incorporated by reference herein.

In step 710, the second wafer handler 89 transfers the wafer 113 from the fourth processing chamber 105 to the second pass-through 97.

In step 711, the first wafer handler 87 transfers the wafer 113 from the second pass-through 97 to the second load lock 93. The wafer 113 thereafter may be removed from the second load lock 93 for subsequent device processing.

In step 712, the controller 107 halts execution of the interconnect program 700 for formation of the interconnect 43, 53 or 63 on wafer 113. It will be understood that although the tool 81 is preferred for formation of the inventive interconnects, other tools (e.g., tools having a single wafer handler chamber) may be employed.

Figure 8:
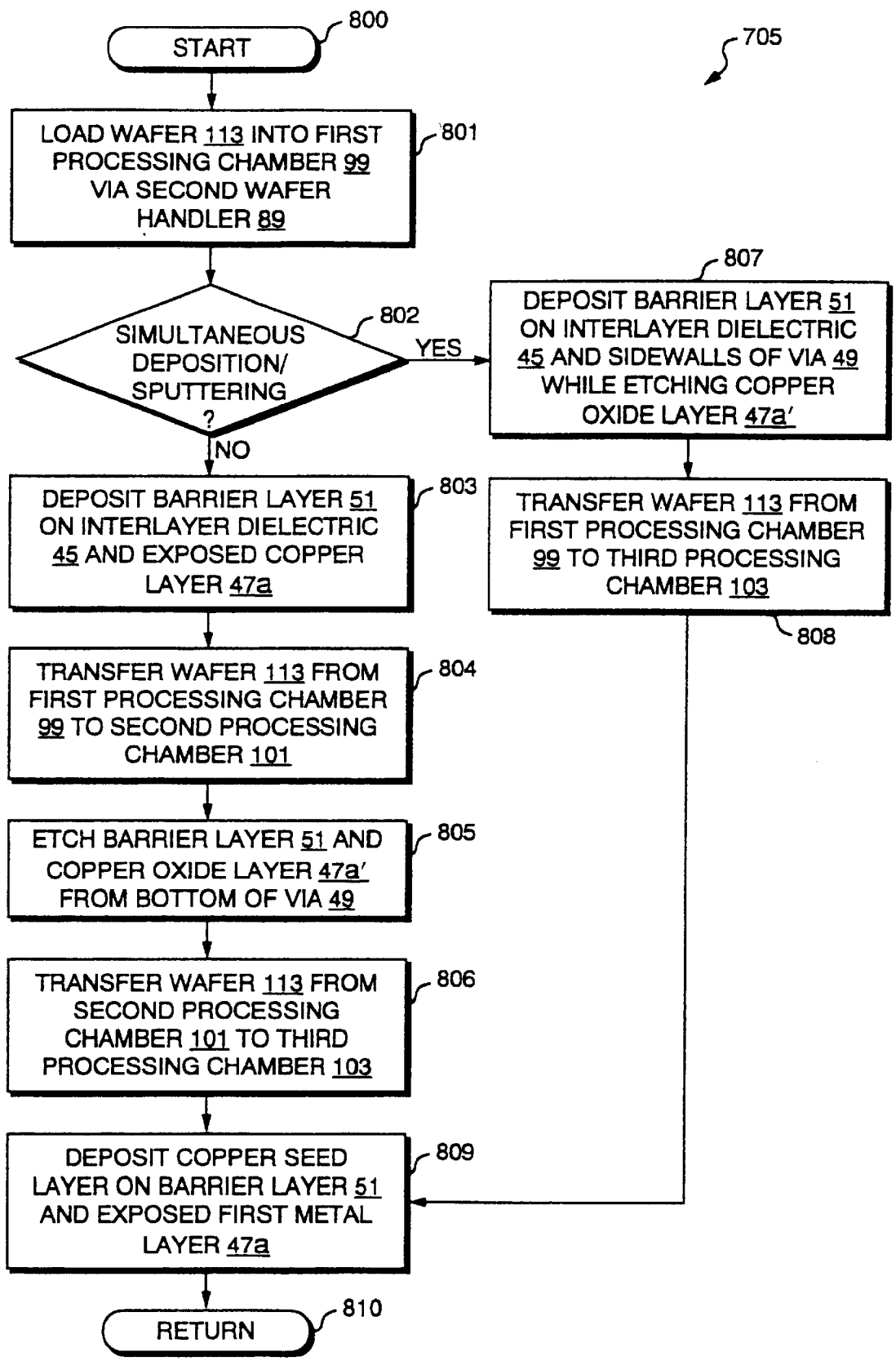
FIG. 8 is a flow chart of a first interconnect subroutine of the flow chart of FIG. 7.

FIG. 8 is a flow chart of the interconnect 43 subroutine 705 of FIG. 7. In step 800, the interconnect 43 subroutine is started.

In step 801, the second wafer handler 89 transfers the wafer 113 from the first pass-through 95 to the first processing chamber 99.

In step 802, the controller 107 selects the processing sequences for either sequential deposition/sputter-etching within separate processing chambers (e.g., the first and second processing chambers 99, 101) (steps 803–806) or simultaneous deposition/sputter-etching within a single processing chamber (e.g., the first processing chamber 99) (steps 807 and 808) based on a previous selection by a user of the tool 81. It will be understood that the interconnect program 700 also may comprise processing sequences for sequential deposition/sputter-etching within a single processing chamber (e.g., the first processing chamber 99) as previously described with reference to FIGS. 2, 3A–C, 4A–D and 5A–C.

For sequential deposition/sputter-etching within separate processing chambers, in step 803 the barrier layer 51 is deposited over the interlayer dielectric 45, the sidewalls of the via 49 and the exposed first copper layer 47a (FIG. 3A). This may be performed via PVD, HDP deposition or CVD.

In step 804, the second wafer handler 89 transfers the wafer 113 from the first processing chamber 99 to the second processing chamber 101.

In step 805, the barrier layer 51 and any copper oxide layer 47a' are sputter-etched to expose the first copper layer 47a (FIG. 3B). Preferably this etching is performed within an Applied Materials' Preclean II chamber.

In step 806, the second wafer handler 89 transfers the wafer 113 from the second processing chamber 101 to the third processing chamber 103.

For simultaneous deposition/sputter-etching, in step 807 the barrier layer 51 is deposited on the interlayer dielectric 45 and the sidewalls of the via 49 while the bottom of the via 49 and the copper oxide layer 47a' are simultaneously sputter etched to expose the first copper layer 47a. Preferably simultaneous deposition/sputter-etching is performed in an HDP chamber such as an Applied Materials' Vectra IMP chamber. As described with reference to FIGS. 2, 3A–C and 5A–C, simultaneous deposition/sputter-etching is achieved by adjusting the ratio of the RF power applied to both the substrate support pedestal 29 and to the wire coil 23 as compared to the DC power applied to the target 27.

In step 808, the second wafer handler 89 transfers the wafer 113 from the first processing chamber 99 to the third processing chamber 103 for copper seed layer deposition. No etching within the second processing chamber 101 is required as the first copper layer 47a is exposed in step 807. Therefore, if simultaneous deposition/sputter-etching is used, the second processing chamber 101 is not required.

Following either sequential or simultaneous deposition/sputter-etching, in step 809 a copper seed layer is deposited on the barrier layer 51 and on the exposed first copper layer 47a. Because the wafer 113 is maintained in a vacuum environment while within the tool 81, essentially no copper oxide reforms on the exposed first copper layer 47a prior to formation of the copper seed layer. An essentially oxide free, low resistance contact thereby is formed between the copper seed layer and the first copper layer 47a. The seed layer may be deposited using PVD, HDP deposition or CVD techniques.

In step 810, the subroutine 705 ends and the program returns to steps 708–712 wherein the via 49 is filled with copper to complete the interconnect 43, and the wafer 113 is placed in the second load lock 93.

Figure 9:
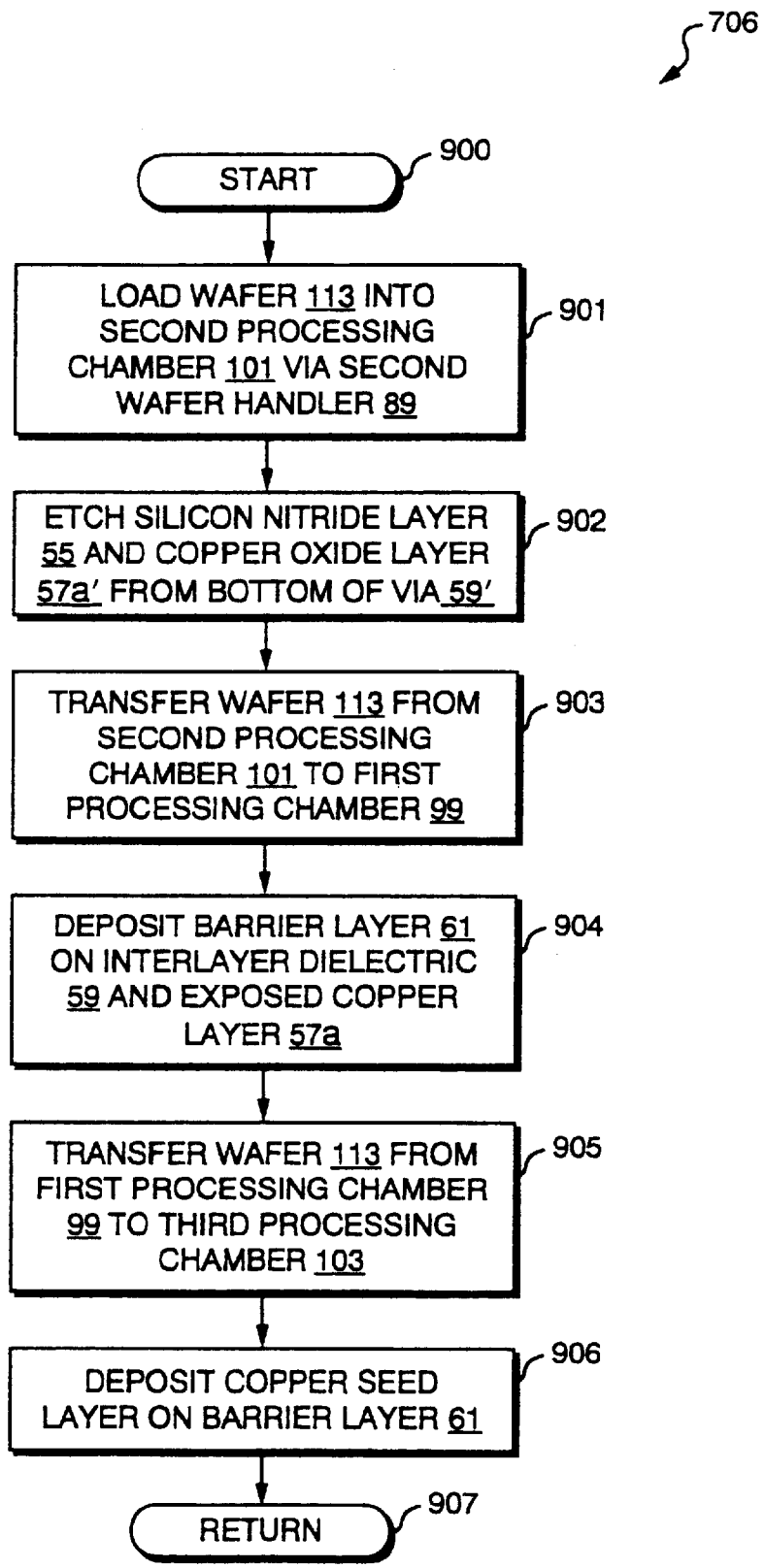
FIG. 9 is a flow chart of a second interconnect subroutine of the flow chart of FIG. 7.

FIG. 9 is a flowchart of the interconnect 53 subroutine 706 of FIG. 7. In step 900, the interconnect 53 subroutine 706 is started.

In step 901, the second wafer handler 89 transfers the wafer 113 from the first pass-through 95 to the second processing chamber 101.

In step 902, the silicon nitride layer 55 and any copper oxide layer 57*a*' are sputter-etched within the second processing chamber 101 to expose the first copper layer 57*a* (FIG. 4B).

In step 903, the second wafer handler 89 transfers the wafer 113 from the second processing chamber 101 to the first processing chamber 99. An alternative to steps 901–903 is to transfer the wafer 113 from the first pass-through 95 to the first processing chamber 99, and to sputter-etch the silicon nitride layer 55 and any copper oxide layer 57*a*' within the first processing chamber 99 (assuming the first processing chamber 99 is an HDP sputtering chamber) as previously described with reference to FIGS. 4A–D. In this manner the second processing chamber 101 is not required.

In step 904, the barrier layer 61 is deposited over the interlayer dielectric 59 and the exposed first copper layer 57*a* (FIG. 4C).

In step 905 the second wafer handler 89 transfers the wafer 113 from the first processing chamber 99 to the third processing chamber 103.

In step 906, a copper seed layer is deposited on the barrier layer 61.

In step 907, the subroutine 706 ends and the program returns to steps 708–712 wherein the via 59' is filled with copper to complete the interconnect 53, and the wafer 113 is placed in the second load lock 93.

Figure 10:
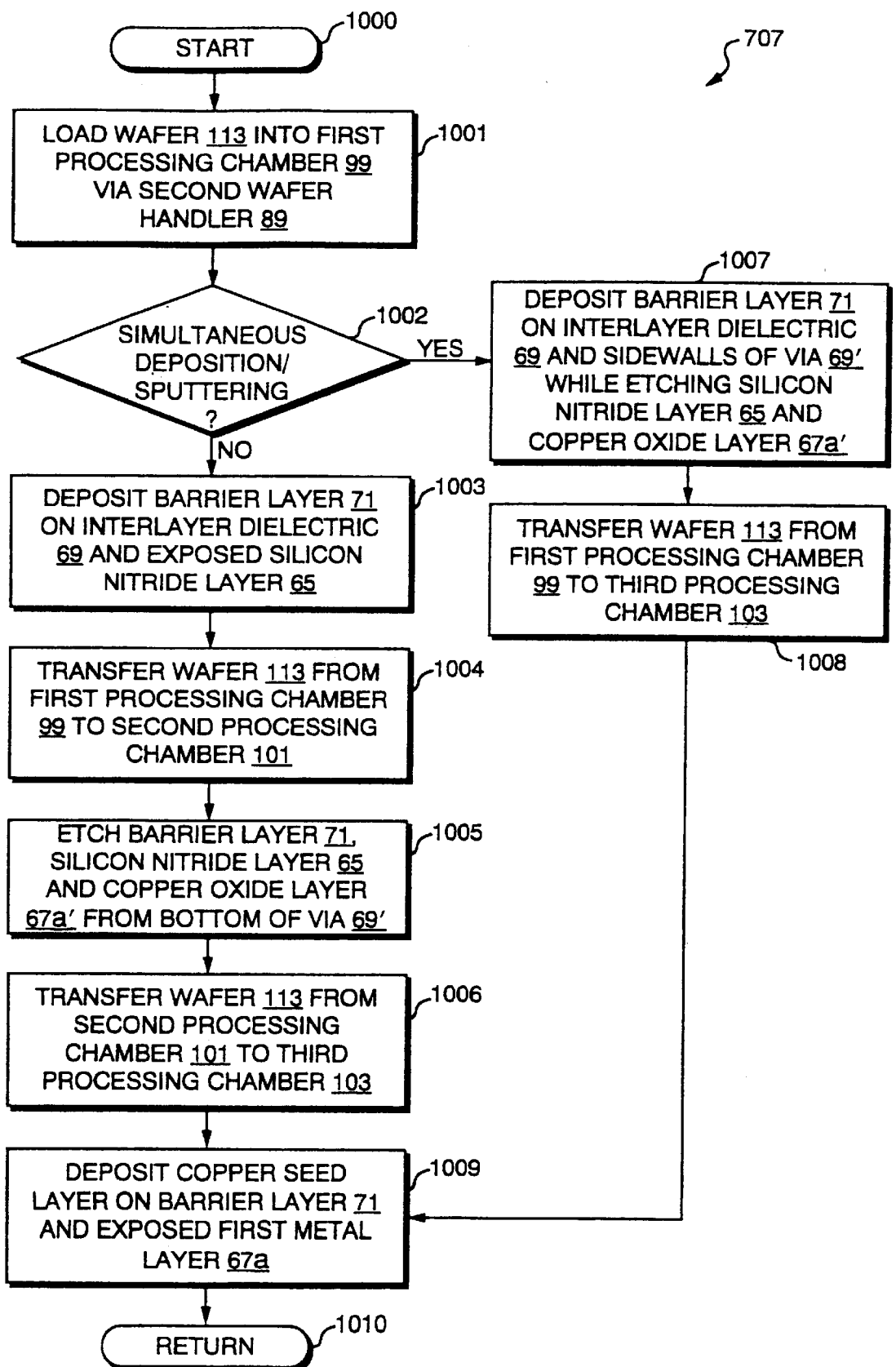
FIG. 10 is a flow chart of a third interconnect subroutine of the flow chart of FIG. 7.

FIG. 10 is a flowchart of the interconnect 63 subroutine 707 of FIG. 7. In step 1000, the interconnect 63 subroutine 707 is started.

In step 1001, the second wafer handler 89 transfers the wafer 113 from the first pass-through 95 to the first processing chamber 99.

In step 1002, the controller 107 selects the processing sequences for either sequential deposition/sputter-etching within separate processing chambers (e.g., the first and second processing chambers 99, 101) (steps 1003–1006) or simultaneous deposition/sputter-etching within a single chamber (e.g., the first processing chamber 99) (steps 1007 and 1008) based on a previous selection by a user of the tool 81. It will be understood that the interconnect program 700 also may comprise processing sequences for sequential deposition/sputter-etching within a single processing chamber (e.g., the first processing chamber 99) as previously described with reference to FIGS. 2, 3A–C, 4A–D and 5A–C.

If sequential deposition/sputter-etching within separate processing chambers is selected, in step 1003 the barrier layer 71 is deposited over the interlayer dielectric 69 and the exposed silicon nitride layer 65 (FIG. 5A). This may be performed via PVD, HDP deposition or CVD.

In step 1004, the second wafer handler 89 transfers the wafer 113 from the first processing chamber 99 to the second processing chamber 101.

In step 1005, the barrier layer 71, the silicon nitride layer 65 and any copper oxide layer 67*a*' are sputter-etched to expose the first copper layer 67*a* (FIG. 5B). Preferably this etching is performed within an Applied Materials' Preclean II chamber.

In step 1006, the second wafer handler 89 transfers the wafer 113 from the second processing chamber 101 to the third processing chamber 103.

If simultaneous deposition/sputter-etching is selected, in step 1007 the barrier layer 71 is deposited on the interlayer dielectric 69 and on the sidewalls of the via 69' while the bottom of the via 69', the silicon nitride layer 65 and the copper oxide layer 67*a*' are simultaneously sputter-etched to expose the first copper layer 67*a*. Preferably simultaneous deposition/sputter-etching is performed in an HDP chamber such as an Applied Materials' Vectra IMP chamber. As described with reference to FIGS. 2, 3A–C and 5A–C, simultaneous deposition/sputter-etching is achieved by adjusting the ratio of the RF power applied to both the substrate support pedestal 29 and to the wire coil 23 as compared to the DC power applied to the target 27.

In step 1008, the second wafer handler 89 transfers the wafer 113 from the first processing chamber 99 to the third processing chamber 103. No etching within the second processing chamber 101 is required as the first copper layer 67*a* is exposed in step 1007. Therefore, if simultaneous deposition/sputter-etching is used, the second processing chamber 101 is not required.

Thereafter, following either sequential or simultaneous deposition/sputter-etching, in step 1009 a copper seed layer is deposited on the barrier layer 71 and on the exposed first copper layer 67*a*. Because the wafer 113 is maintained within a vacuum environment during transfer among the chambers 99–105, essentially no copper oxide reforms on the exposed first copper layer 67*a* prior to formation of the copper seed layer. An essentially oxide free, low resistance contact thereby is formed between the copper seed layer and the first copper layer 67*a*. The seed layer may be deposited using PVD, HDP deposition or CVD techniques.

In step 1010, the subroutine 707 ends and the program returns to steps 708–712 wherein the via 69' is filled with copper to complete the interconnect 63, and the wafer 113 is placed in the second load lock 93.

The interconnect program 700 of FIGS. 7–10 is merely exemplary. Alternatively, the program may comprise only a single subroutine 705, 706, 707, and/or each subroutine may contain only the sequential deposition and etch steps (within single or multiple processing chambers) or the simultaneous deposition and etch steps. Further, a number of steps may be performed prior to placing the wafer 113 within the tool 81, and with respect to the interconnects 43 and 63, the interconnect program therefore may be as simple as depositing the second copper layer on the exposed first copper layer and thereby creating direct metal-to-metal contact between the first and second copper layers.

As is known in the art, the controller 107 may comprise a plurality of interfaced controllers, each of the plurality of controllers having input/output ports for receiving/transmitting control signals from/to other controllers, processing chambers, etc., interfaced thereto. Such control signals control various chamber conditions such as temperatures, pressures, flow rates, wafer, coil and target biases, etc., so as to achieve the desired processing step (e.g., deposition, etch, etc.) as is known in the art.

The foregoing description discloses only the preferred embodiments of the invention, modifications of the above disclosed apparatus and method which fall within the scope of the invention will be readily apparent to those of ordinary skill in the art. For instance, while the present invention has been disclosed with reference to copper interconnects, other metal interconnects suffering from the deleterious effects of mobile-atom-induced via-to-via leakage currents and/or electrical defects may benefit from the teachings disclosed herein. A wide variety of barrier layer materials may be employed, and, while use of a high density plasma chamber is preferred, other deposition chambers may be used for simultaneous and/or sequential deposition/sputter-etching.

Accordingly, while the present invention has been disclosed in connection with the preferred embodiments thereof, it should be understood that other embodiments may fall within the spirit and scope of the invention, as defined by the following claims.

The invention claimed is:

1. A process for sputter depositing a barrier layer on a bottom and sidewalls of a via defined in a dielectric layer over a copper feature of a semiconductor substrate disposed on a support pedestal in a sputter deposition chamber having a sputtering target and an RF coil for coupling RF energy to a plasma maintained between the sputtering target and the support pedestal, the process comprising the steps of:
   (a) sputter depositing a barrier layer onto the sidewalls and bottom of the via by applying power to at least the sputtering target and the support pedestal; and
   (b) reducing a thickness of the barrier layer on the bottom of the via by applying power to at least the RF coil and the support pedestal.

2. The process of claim 1 wherein steps (a) and (b) are performed simultaneously.

3. The process of claim 1 wherein step (b) includes applying power to the target.

4. The process of claim 3 wherein steps (a) and (b) comprise adjusting a level of power applied to the target, a voltage level and duty cycle applied to the support pedestal and an RF power applied to the RF coil so as to sputter deposit the barrier layer onto the sidewalls and bottom of the via and sputter etch the barrier layer from the bottom of the via.

5. The process of claim 1 wherein step (a) includes applying power to the RF coil.

6. The process of claim 1 wherein steps (a) and (b) are performed sequentially.

7. The process of claim 1 wherein depositing a barrier layer comprises depositing at least one of tantalum and tantalum nitride.

8. The process of claim 1 wherein depositing a barrier layer comprises depositing tantalum.

9. A process for deposition of copper within a via having sidewalls and a bottom defined in a dielectric layer over a copper feature, comprising:
   in a high density plasma deposition chamber coupled to a transfer chamber, performing the steps of:
      depositing a barrier layer on the sidewalls and bottom of the via; and
      exposing at least a portion of the copper feature by sputtering both the barrier layer on the bottom of the via and any copper oxide layer on at least a portion of the copper feature;
   transferring the substrate from the high density plasma deposition chamber to a copper seed layer deposition chamber coupled to the transfer chamber without breaking vacuum; and
   in the copper seed layer deposition chamber, depositing a copper seed layer over the sidewalls and bottom of the via.

10. A process for deposition of copper within a via having sidewalls and a bottom defined in a dielectric layer over a copper feature, comprising:
    in a high density plasma deposition chamber coupled to a transfer chamber, performing the steps of:
       depositing a barrier layer on the sidewalls and bottom of the via; and
       reducing a thickness of the barrier layer on the bottom of the via by sputtering the barrier layer on the bottom of the via;
    transferring the substrate from the high density plasma deposition chamber to a copper seed layer deposition chamber coupled to the transfer chamber without breaking vacuum; and
    in the copper seed layer deposition chamber, depositing a copper seed layer over the sidewalls and bottom of the via.

11. The process of claim 10 wherein depositing a barrier layer comprises depositing tantalum.

12. A process for sputter depositing a barrier layer on a bottom and sidewalls of a via defined in a dielectric layer over a copper feature of a semiconductor substrate disposed on a support pedestal in a sputter deposition chamber having a sputtering target and an RF coil for coupling RF energy to a plasma maintained between the sputtering target and the support pedestal, the process comprising the steps of:
    (a) sputter depositing a barrier layer onto the sidewalls and bottom of the via by applying power to at least the sputtering target and the support pedestal; and
    (b) exposing at least a portion of the copper feature by sputtering both the barrier layer on the bottom of the via and any copper oxide layer on at least a portion of the copper feature by applying power to at least the RF coil and the support pedestal.

13. The process of claim 12 wherein depositing a barrier layer comprises depositing at least one of tantalum and tantalum nitride.

14. A process for deposition of a barrier layer within a via having sidewalls and a bottom defined in a dielectric layer over a copper feature, comprising:
    during a first time period, depositing a barrier layer on the sidewalls and bottom of the via; and
    during a second time period:
       depositing the barrier layer on the sidewalls and bottom of the via; and
       reducing a thickness of the barrier layer on the bottom of the via by sputtering the barrier layer on the bottom of the via, wherein depositing the barrier layer on the bottom of the via and reducing the thickness of the barrier layer on the bottom of the via occur simultaneously during at least a portion of the second time period.

15. The process of claim 14 wherein depositing a barrier layer comprises depositing at least one of tantalum and tantalum nitride.

16. A process for deposition of a barrier layer within a via having sidewalls and a bottom defined in a dielectric layer over a copper feature, comprising:
    during a first time period, depositing a barrier layer on the sidewalls and bottom of the via; and
    during a second time period:
       depositing the barrier layer on the sidewalls and bottom of the via; and
       exposing at least a portion of the copper feature by sputtering both the barrier layer on the bottom of the via and any copper oxide layer on at least a portion of the copper feature, wherein depositing the barrier layer and exposing at least a portion of the copper feature occur simultaneously during at least a portion of the second time period.

17. The process of claim 16 wherein depositing a barrier layer comprises depositing at least one of tantalum and tantalum nitride.

18. A process for deposition of copper within a via having sidewalls and a bottom defined in a dielectric layer over a copper feature, comprising:
    depositing a barrier layer on the sidewalls and bottom of the via;

reducing a thickness of the barrier layer on the bottom of the via by sputtering the barrier layer on the bottom of the via, wherein depositing the barrier layer on the bottom of the via and reducing the thickness of the barrier layer on the bottom of the via occur simultaneously; and depositing a copper layer over the sidewalls and bottom of the via.

19. The process of claim 18 wherein depositing a barrier layer comprises depositing tantalum.

20. The process of claim 18 wherein depositing a copper layer comprises depositing a copper seed layer.

21. The process of claim 20 further comprising performing a copper electroplating process to fill the via with copper.

22. A process for sputter depositing a barrier layer on a bottom and sidewalls of a via defined in a dielectric layer over a copper feature, comprising:

in a high density plasma chamber having a sputtering target:

(a) depositing a barrier layer onto the sidewalls and bottom of the via; and (b) sputtering the barrier layer on the bottom of the via while applying power to the sputtering target.

23. The process of claim 22 wherein steps (a) and (b) are performed simultaneously.

24. The process of claim 22 wherein step (b) includes applying power to an RF coil and a substrate support pedestal of the high density plasma chamber.

25. The process of claim 22 wherein steps (a) and (b) are performed sequentially.

* * * * *